US005539326A

United States Patent [19]

Takahashi et al.

[11] Patent Number: 5,539,326

[45] Date of Patent: Jul. 23, 1996

[54] METHOD FOR TESTING THE WIRING OR STATE OF A LIQUID CRYSTAL DISPLAY AND THIN FILM TRANSISTOR

[75] Inventors: Isamu Takahashi; Tadashi Oshimi, both of Tokyo, Japan

[73] Assignee: Tohken Industries Co., Ltd., Tokyo, Japan

[21] Appl. No.: 285,971

[22] Filed: Aug. 4, 1994

[30] Foreign Application Priority Data

Jun. 7, 1994 [JP] Japan .................................... 6-159073

[51] Int. Cl.[6] .................................................... G01R 31/00

[52] U.S. Cl. ............................................ 324/770; 324/678

[58] Field of Search ................................... 324/770, 678, 324/658; 345/87, 92

[56] References Cited

U.S. PATENT DOCUMENTS

| | | | |
|---|---|---|---|
| 5,073,754 | 12/1991 | Henley | 345/87 |
| 5,081,687 | 1/1992 | Henley et al. | 345/87 |
| 5,262,720 | 11/1993 | Senn et al. | 324/537 |
| 5,377,030 | 12/1994 | Suzuki et al. | 324/770 |
| 5,428,300 | 6/1995 | Takahashi et al. | 324/770 |
| 5,432,461 | 7/1995 | Henley | 324/770 |

*Primary Examiner*—Ernest F. Karlsen
*Assistant Examiner*—Russell M. Kobert
*Attorney, Agent, or Firm*—Burgess, Ryan and Wayne

[57] ABSTRACT

A method of testing if the wiring or state of a TFT and LCD is abnormal includes the following steps: In a first operation, a TFT is turned on for a given time period to charge the cell capacitor connected to an LCD through the data line thereof. Next, the TFT is turned off, maintaining the charged condition. Then, the TFT is turned on again for a given time period T to release the stored electric charge through the source, drain and a grounded resistor. Changes with time in the output of source current ($i_1$) or voltage ($V_1$) induced by the discharge are input into a computer. In a second operation, the TFT is turned on for a given time period without charging the cell capacitor through the data line. After turning off the TFT for the same time as the first operation, the TFT is turned on again for a given time period to release the stored charge through the source, drain and grounded resistor. Then, changes with time in the output of source current $i_2$ or source voltage $V_2$ induced by discharge are input into the computer. In a third operation, the computer calculates the integration:

$$\int_0^T (i_1 - i_2)dt \text{ or } \int_0^T (v_1 - v_2)dt$$

The computer judges whether the TFT-LCD is properly wired or the state of the TFT and LCD is normal by checking whether the calculation is smaller than a reference value of $V_sC_{so}$ $(R_{on}+R_g)$ or $I_sC_{so}$ $(R_{on}+R_g)$.

10 Claims, 7 Drawing Sheets

METHOD FOR TESTING THE WIRING OR STATE OF A LIQUID CRYSTAL DISPLAY AND THIN FILM TRANSISTOR

BACKGROUND OF THE INVENTION

This invention relates to a method for testing the connection of a liquid crystal display and thin film transistor (the connection of both hereinafter called TFT-LCD) that is used as an array and color LCDS employing TFTs.

Recently active-matrix LCDS are most widely used as color liquid crystal displays. This type of LCDS is characterized by a design that permits writing necessary signals into a liquid crystal only for a given short period of time. At other times, the gate of the input circuit leading to the liquid crystal is kept open to hold the written signals. Thus, the liquid crystal functions like a dynamic memory.

The gate is thus closed only for a limited period of time required for the writing of necessary signals and opened at other times. This is why thin-film transistors (TFT's) or field-effect transistors (FETs) are commonly used.

The use of TFTs-LCDS as active-matrix LCDS for color displays has been increasingly recently.

FIG. 1 shows the outline of a TFT-LCD, whereas FIG. 2 is a circuit diagram indicating the interconnections of the components in a TFT-LCD. Because a sheet of liquid-crystal display contains many picture elements, extremely large numbers of TFTs 4, gate lines 3 and data lines 5 are used in correspondence therewith.

However, not all TFTs always function properly. Not all connections between TFTs 4 and data lines 5 and gate lines 3 and between individual gate lines and data lines are always properly made, too.

Before completing liquid-crystal displays, therefore, it is essential to determine that they are in proper condition.

With no efficient method to conduct such test established, however, conventional TFT-LCD systems have been assembled without making such preliminary test. Otherwise, each individual TFT has been checked for proper wiring with their peripheral devices by using cumbersome practices.

To solve this problem, the applicant proposed a new technology in the method and apparatus for testing TFT-LCDs in Japanese Patent Application No. 133796 of 1993.

This technology tests the wiring condition of TFT-LCDs in an active color LCD in which the drain of a TFT is connected to a grounded cell capacitor Cs. As shown in FIG. 3(*a*) the cell capacitor of an LCD is charged through a data line by turning on the TFT for a given period of time. Specifically, when a gate voltage $V_G$ and a data voltage $V_D$ are applied to the circuit shown in FIG. 2 and the switch $S_d$ is turned on, the cell capacitor $C_s$ is charged with the data voltage $V_D$ at the time that a pulse voltage of the gate voltage $V_G$ exists. Next, the charged condition is maintained by turning off the TFT for a given length of time. Specifically, after the pulse of the gate voltage $V_G$ is removed and the TFT is turned off, the resistance between the source and drain of the TFT becomes $10^5$ to $10^6$ times greater than that built up while the TFT is turned on by the gate voltage $V_G$. Therefore, the cell capacitor $C_s$ remains charged, with the charge held thereby decreasing only slowly through leakage. Then, the TFT is turned on again to release the stored electric charge through a resistor connected to the ground through the source and drain of the TFT. Specifically, when the TFT is turned on again between the source and drain thereof with the passage of a pulse of the gate voltage $V_G$, the charge held in the cell capacitor $C_s$ is discharged through the resistor $R_g$ connected to the source of TFT. Whether or not the wiring is proper is determined by checking the waveform of current or voltage induced by the discharge.

To achieve the check of the waveform of current or voltage described above, the conditions of discharge with maximum and minimum current or voltage through a properly functioning and wired TFT-LCD are predetermined as shown in FIG. 5. Then, whether the actual discharge current or voltage is within the pre-established range between the maximum and minimum limits can be determined.

In this test, however, the discharge output itself does not does not arise from the output of the cell capacitor $C_s$ because the test is conducted under the influence of the stray capacitance between the TFT and data line and between the data and gate lines.

When such a stray capacitance is present, a wrong wiring could be mistaken for a proper one.

The chance of such misjudgement is high especially when small-capacity cell capacitance $C_s$ is used to increase the percentage aperture of liquid crystals.

The object of this invention is to provide a method for testing TFT-LCDs that assures correct judgement of the connection of TFT-LCDs and operation of TFTs even in the presence of the stray capacitance mentioned before.

SUMMARY OF THE INVENTION

To solve the above problem, a method of this invention determines if the wiring of a TFT-LCD or the operation of a TFT is proper by the following two operations: In the first operation, a TFT is turned on for a given period of time to charge the cell capacitor connected to an LCD through the data line thereof. Next, the TFT is turned off to maintain the charged condition. Then, the TFT is turned on again for a given period of time to release the stored electric charge through the source and drain thereof and through a grounded resistor. Changes with time in the output of source ($i_1$) current or voltage ($V_1$) induced by the discharge are input into a computer. In the second operation, the TFT is turned on for a given period of time without charging the cell capacitor of the LCD through the date line. After turning off the TFT for the same length of time as that during which the charged condition was maintained in the first step, the TFT is turned on again for a given period of time to release the stored electric charge through the source and drain thereof and through a grounded resistor. Then, changes with time in the output of source current ($i_2$) or voltage ($v_2$) induced by the discharge are input into the computer. The computer then integrates the difference between the output current or voltage obtained in the first step, with the cell capacitor charged, and that in the second step, with the cell capacitor not charged, at selected corresponding times. Or, otherwise, the computer performs time-series integration on each of the output current or voltage obtained in the first step, with the cell capacitor charged, and the second step, with the cell capacitor not charged. Specifically, the computer calculates the following integration:

$$\int_0^T (i_1 - i_2)dt \text{ or } \int_0^T (v_1 - v_2)dt$$

Then, the computer determines the difference between the obtained results. Finally, the computer judges whether or not the TFT-LCD is properly wired or the TFT functions properly by checking if the TFT-LCD is properly wired or the state of TFT and LCD is normal or not by checking if the above calculation is smaller than the reference value of $V_sC_{so}$ ($R_{on}$+$R_g$) or $I_sC_{so}$ ($R_{on}$+$R_g$), where $V_s$ is the standard initial value of source voltage, when the LCD and TFT are normal, at the time of discharge of the cell capacitor ($C_s$) when the gate of TFT is on and data voltage $V_D$ is not supplied, and $I_s$ is the standard initial value of current, when the LCD and TFT are normal, at the time of discharge of the cell capacitor ($C_s$); $C_{so}$ is the value of the capacitor of the standard and normal LCD; $R_{on}$ is the standard and normal value of resistance between the source and drain of the TFT in the case where the data line is on, and $R_g$ is the value of resistance which is set up at the source line.

BRIEF DESCRIPTION OF THE DRAWINGS

FIGS. 10(*a*) 11(*b*) and are 11(*c*) are plan views of display panels simulating the arrangement of TFT-LCDs to show the display area of a fourth embodiment of this invention.

DETAILED DESCRIPTION OF THE INVENTION

The operating principle of this invention will be described by reference to the unit circuit shown in FIG. 2.

Figure 1:
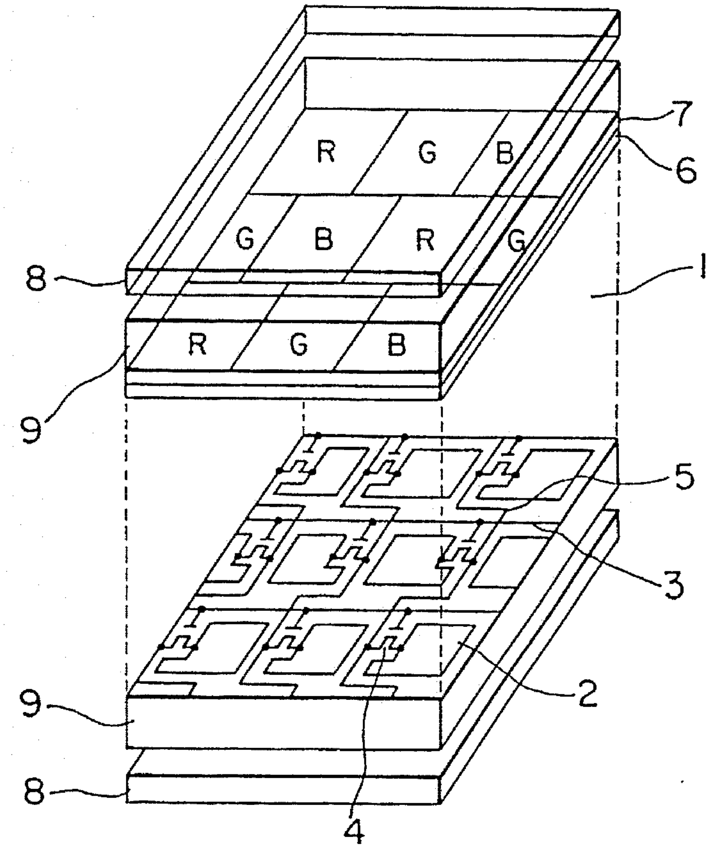
FIG. 1 is a perspective view showing the outline of cells making up a liquid crystal display.
Figure 2:
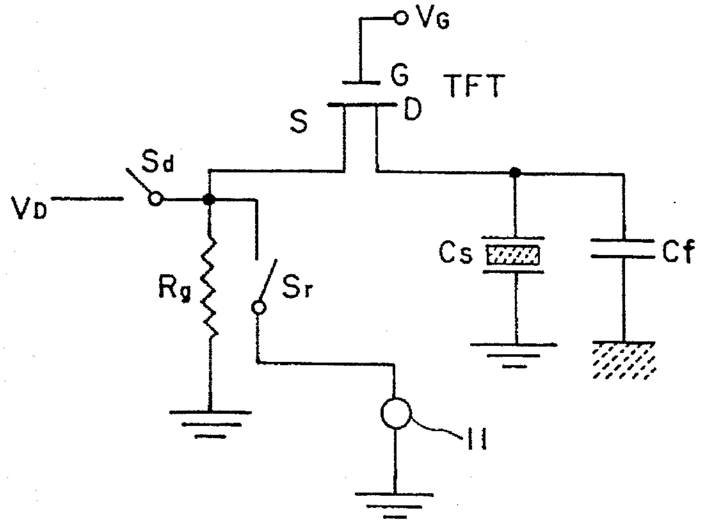
FIG. 2 is a basic circuit diagram showing the basic makeup of a TFT-LCD circuit prerequisite to this invention.
Figure 3A:
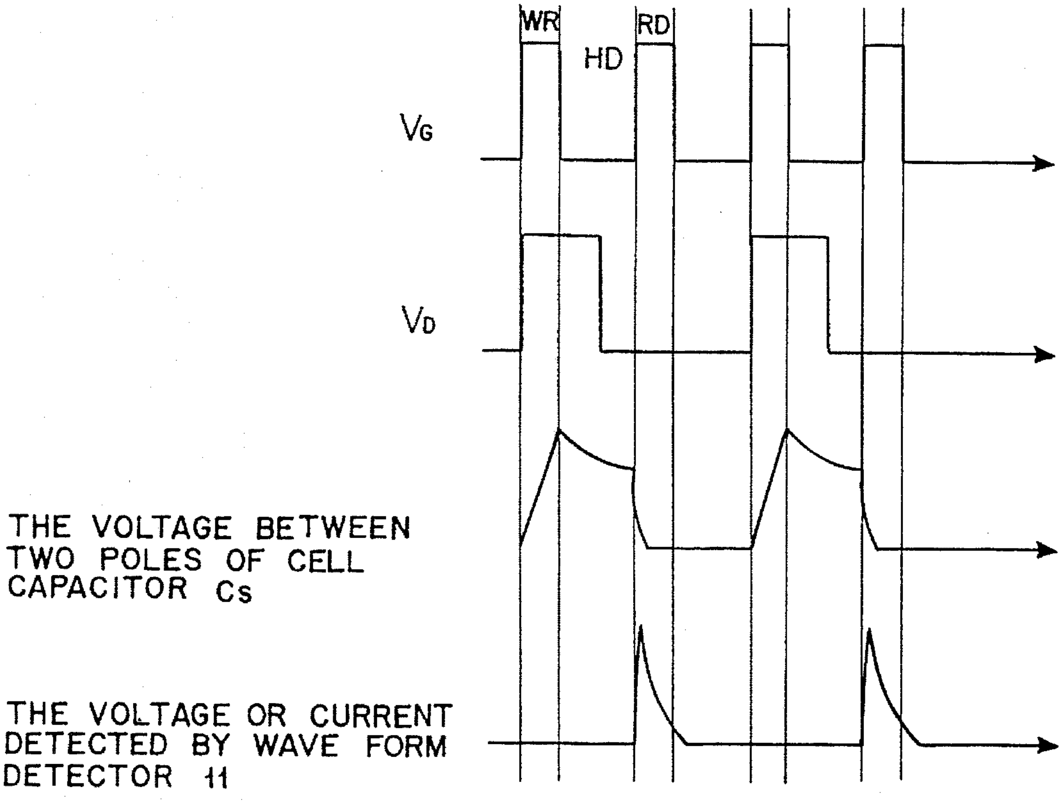
FIG. 3*a* and 3*b* graphically show the waveforms of input and discharged output in the first and second steps of this invention at (a) and (b).
Figure 3B:
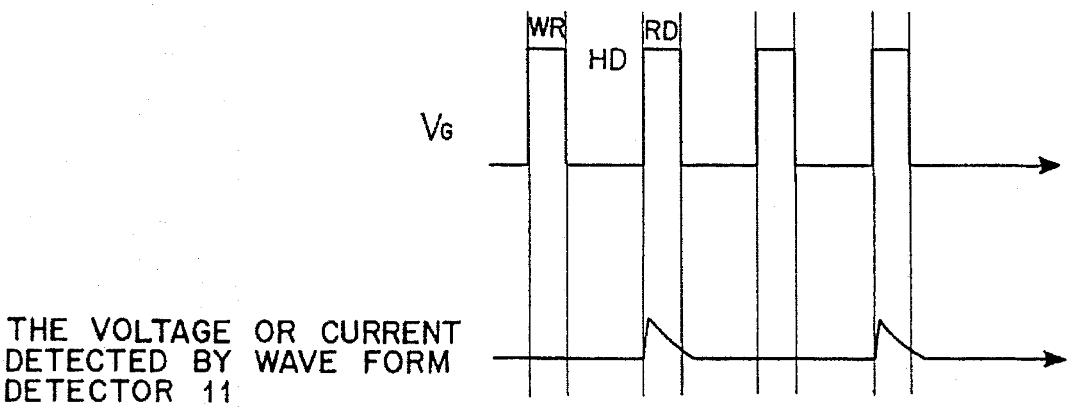

When gate-line voltage $V_G$ and data-line voltage $V_D$ shown in FIG. 3(*a*) are applied to a circuit shown in FIG. 2, with a switch $S_d$ turned on, a cell capacitor $C_s$ is charged with the data-line voltage $V_D$ while the pulse voltage of the gate-line $V_G$ is present.

While the first switch $S_d$ is on, a second switch $S_r$ is off because there is no need for a waveform analyzer 11 to measure the data-line voltage $V_D$.

When the TFT is turned off after passing the pulse voltage of the gate-line voltage $V_G$, the resistance between the source and drain of the TFT becomes $10^5$ or $10^6$ times greater than when the TFT is turned on with the gate-line voltage $V_G$. Therefore, the cell capacitor $C_s$, remains electrically charged because no greater loss of charged electricity than, for example, by leakage occurs.

Next, when the passage of the pulse voltage of the gate-line voltage $V_G$ connects the source and drain of the TFT, the first switch $S_d$ is turned off and the second switch $S_r$ between the drain and the waveform analyzer is turned on, and the electric charge stored in the cell capacitor $C_s$ is released through a resistor $R_g$ connected to the drain and source.

The first switch $S_d$, which is turned off to prevent unwanted troubles on the data-line power supply, is not an indispensable component element of this invention.

When a guard ring is connected to each terminal in the course of the manufacture of a TFT-LCD, the resistor $R_g$ serves as a resistor between the drain of each TFT and the ground including the guard ring. When the guard ring is disconnected, the resistor $R_g$ serves as a resistor artificially connected for convenience of measurement at the waveform analyzer 11 that is designed to have a resistance not more than one-hundredths of the resistance ($R_{on}$) that exists between the source and drain when the TFT is on.

When the second switch $S_r$ is turned on, the waveform analyzer detects the current or voltage induced by the discharge. However, the second switch $S_r$ too is not an indispensable component of this invention.

Part of the current or voltage induced by the discharge generates a sawtooth waveform as indicated by the third curve from the top of FIG. 3(*a*). The time constant T at the time is approximately equal to $C_s(R_{on}+R_g)$.

Because the capacity of the cell capacitor $C_s$ is known beforehand, the cell capacitor, gate and data lines are considered to be properly connected when the time constant of the current passing through the resistor $R_g$ agrees with the predicted value.

When the time constant T of the voltage or current induced by the discharge changes and its waveform disagrees with the predicted one, in contrast, the value of $R_{on}$ or $C_s$ is considered to deviate from the specification. This deviation means that the operation of the TFT or its connection with the peripheral devices is improper.

Lack of electric current in the resistor $R_g$ means a failure to store electric charge in the cell capacitor $C_s$. This condition is indicative of some irregularities in the connection between the TFT and the gate and data lines.

However, stray capacitance between the TFT and drain or between the leads on the drain and gate sides sometimes generates an output voltage or current having a regular sawtooth waveform, as shown in FIGS. 3(*a*) and 3(*b*), even when the cell capacitor $C_s$ is not properly connected.

Figure 4:
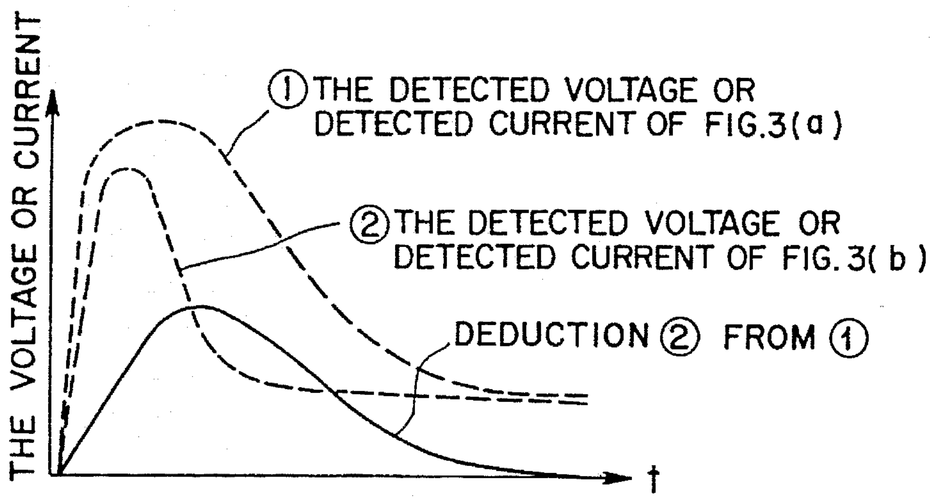
FIG. 4 graphically shows the difference between the outputs shown in FIGS. 3(*a*) and 3(*b*), respectively.
Figure 5:
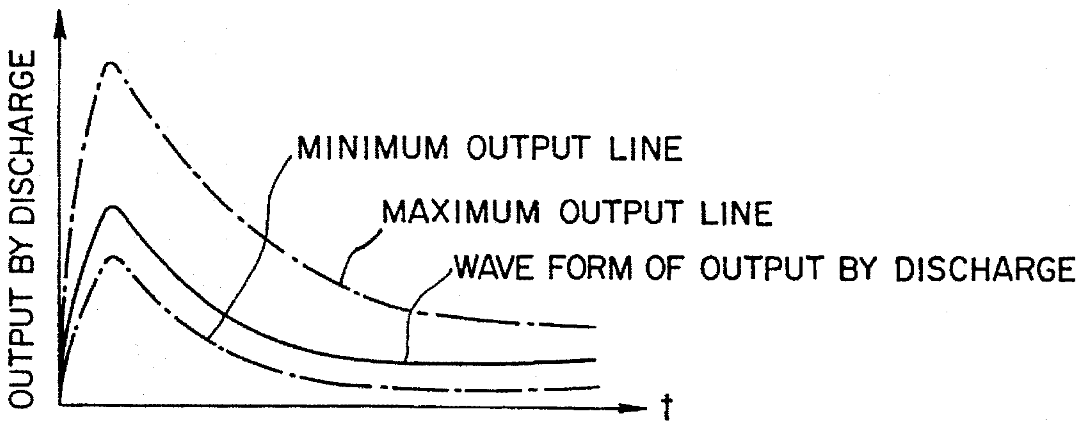
FIG. 5 PRIOR ART
FIG. 5 graphically shows the outputs that illustrate the operating principle of the prior art.

To cancel such output by stray capacitance, the method of this invention provides a test voltage or current corresponding to the gate voltage $V_G$ and data voltage $V_D$, which are shown at in FIGS. 3(*a*) and 3(*b*), in the first step. Next, in the second step, a test voltage or current is obtained by applying the same Gate voltage $V_G$ as the one shown in FIGS. 3(*a*) and 3(*b*) without charging the cell capacitor $C_s$by reducing the data voltage $V_D$ to 0. Then, a difference in output voltage or current is determined as shown in FIG. 4 by calculating the difference at different times by employing a computer.

When the gate voltage ($V_G$) is supplied to the TFT and the data voltage ($V_D$) is 0 (at the period of $R_D$ in FIG. 3(*a*) and FIG. 3(*b*)), the transient voltage $V_1$ at the detector 11 during the first part of the operation (shown in FIG. 3(*a*)) is expressed by the following formula.

$$V_1=V_s \exp\{-t/(C_s+C_f)(R_{on}+R_g)\}$$

where $R_{on}$ is the resistance between the source and drain when the TFT is on, $V_s$ is the initial value of source voltage at the time of discharge of cell capacitor ($C_s$), as shown in FIG. 3(*a*) (the same $V_s$ as used in the reference value noted above), and $C_f$ is the stray capacitor.

The rising time of voltage, as shown in FIG. 3(*a*), is ignored at the time t=0, because the rising time is very short.

On the other hand, the transient voltage $V_2$ in the second operation shown in FIG. 3(*b*) is expressed by the following formula.

$$V_2=V_s' \exp\{-t/C_f(R_{on}+R_g)\}$$

where $C_f$ is the stray capacitor, and $V_s'$ is the initial value of source voltage at the time of discharge of the stray capacitor shown in FIG. 3(*b*).

Generally $V_s'<V_s$ because $V_s'$ is subject to the charge of the stray capacitor $C_f$, and $V_s$ is subject to the charge of both the cell capacitor $C_s$ and stray capacitor $C_f$.

Therefore, $V_2<V_s \exp\{-t/C_f(R_{on}+R_g)\}$. When $V_1-V_2$ is integrated in the period RD in FIG. 3(*a*) and FIG. 3(*b*), the following integration formula is obtained.

$$\int_0^T (V_1-V_2)dt > \int_0^T \exp(-t/(C_s+C_f)(R_{on}+R_g))dt - V_s\left.\int_0^T \exp(-t/C_f)(R_{on}+R_g)\right)dt \approx V_sC_s(R_{on}+R_g)$$

where T is the termination time on inputting gate voltage of the TFT at the period RD in FIG. 3(*a*) and FIG. 3(*b*), and can be regarded as external time ∞. This is because the values $\exp\{-t/(C_s+C_f)(R_{on}+R_g)\}$ and $\exp\{-t/C_f(R_{on}+R_g)\}$ are nearly equal to 0. In the above formula, the stray capacitance $C_f$ can be deleted as being small and we can obtain the value $V_sC_s(R_{on}+R_g)$ of the integration of the difference in outputs.

The reason why the above first and second operations are used and the above integration is calculated for deleting stray capacitance $C_f$ is as follows.

The value $V_sC_s(R_{on}+R_g)$ relates to the wiring of the TFT or the state of the TFT and the state of the LCD.

Because a short in the wiring of the array of the TFT-LCD results in $V_s$=0, a capacitance value $C_s$ of an abnormal LCD is smaller than the capacitance value of capacitor $C_{so}$ of a normal or standard LCD, and the abnormal state of the TFT results in the state of the gate being off and the state of $V_g$=0.

Before the test of whether the wiring of the TFT or the state of the TFT and LCD is normal or not, the "reference value" of $V_sC_{so}(R_{on}+R_g)$ is determined by a pre-test of the TFT-LCD where the TFT and LCD are normal.

If the value of the following integration is smaller than the reference value of $V_sC_{so}(R_{on}+R_g)$, the wiring of the TFT or the state of the TFT and LCD must be abnormal. As shown above, the following integration value must be larger than the value of $V_sC_{so}(R_{on}+R_g)$ in the case where the wiring of the TFT or the state of the TFT and LCD is normal.

$$\int_0^T (V_1-V_2)dt$$

Consequently, we can test whether the wiring of the TFT or the state of the TFT and LCD are normal or not by testing whether the above value of integration is larger than the reference value of $V_sC_{so}(R_{on}+R_g)$ or not.

In the above formula, the transient voltages $V_1$ and $V_2$ are used. However, if the detector 11 is an ammeter, the following formulae of current can be used.

$$i_1=I_s \exp\{t/(C_s+C_f)(R_{on}+R_g)\}$$

$$i_{2=Is}' \exp\{t/C_f(R_{on}+R_g)\}$$

where $R_g$ is the resistance between the source and drain when the TFT is on, $I_s$ is initial value of source current at the time of discharge of cell capacitor ($C_s$) shown in FIG. 3(*a*) (the same corresponding to $V_s$ in regard to the "reference value" noted above), and $I_s'$ is the initial value of the source current at the time of discharge of the stray capacitor $C_f$, as shown in FIG. 3(*b*).

The rising time of current is ignored at the time t=0 because the rising time is very short.

Similarly, $$\int_0^T (i_1-i_2)dt > I_gC_s(R_{on}+R_g)$$

Therefore, we can judge whether the wiring of the TFT-LCD or the operation of the TFT and LCD is normal or not by testing whether the following integration value is larger than the reference value of $I_gC_{so}(R_{on}+R_g)$ or not.

$$\int_0^T (i_1-i_2)dt$$

Some concrete examples of irregularities in discharge output and connection between individual elements will be described below.

As will be discussed later in the description of Example 1, an actual TFT-LCD has multiple gate and data lines corresponding to the vertically and horizontally arranged TFTs to represent the individual picture elements. The function and connection of the TFT-LCD and the operation of the TFTs are checked by switching on and off the gate and data lines by using a relay.

Figure 6A:
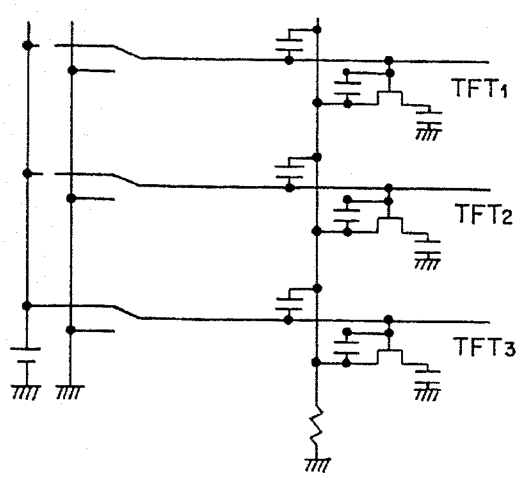
FIG. 6(*a*) shows a circuit diagram of a TFT-LCD whose data line is disconnected and FIG. 6(*b*) shows a graphical representation of the output from the detecting side thereof corresponding to FIGS. 3(*a*) and 3(*b*), respectively. spectively.
Figure 6B:
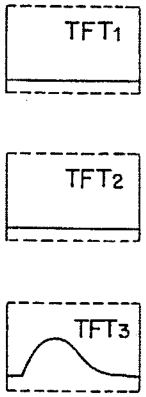

If the data line between $TFT_2$ and $TFT_3$ is disconnected as shown in FIG. 6(*a*), and $C_{s1}$ and $C_{s2}$ are not electrically charged. Then, the difference in output corresponding to that shown in FIG. 4 is 0, as shown in FIG. 6(*b*). (Similarly, the difference between the integrated values of the test voltage or current corresponding to those shown in FIGS 3(*a*) and 3(*b*) is also 0.)

When $C_{s3}$ is electrically charged as shown in FIG. 6(*b*), by comparison, a normal difference in output and a normal result of integration corresponding to those in FIG. 4 are obtainable. (Similarly, a normal result of integration can be obtained for the test voltage or current corresponding to those shown in FIGS 3(*a*) and 3(*b*).

The integrated value of the difference between outputs or the difference between the integrated values of the test voltage or current shows whether or not the data line is disconnected.

Figure 7A:
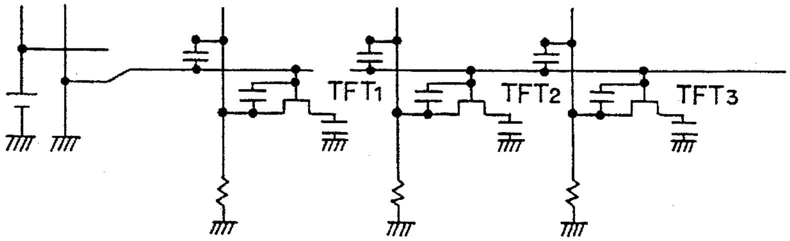
FIG. 7(*a*) shows a circuit diagram of a TFT-LCD whose gate line is disconnected and FIG. 7(*b*) shows a graphical representation of the output from the detecting side thereof corresponding to FIGS. 3(*a*) and 3(*b*) respectively.
Figure 7B:
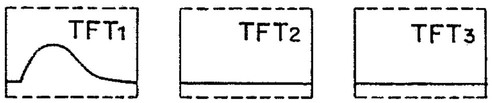

If the gate line between $TFT_1$ and $TFT_2$ is disconnected as shown in FIG. 7(*a*), $C_{s2}$ and $C_{s3}$ are not electrically charged. Then, the difference in output corresponding to that shown in FIG. 4 is 0, as indicated by the waveform of the output difference shown at in FIG. 7(*b*). (Similarly, the difference between the integrated values of the test voltage or current corresponding to those shown in FIGS. 3(*a*) and 3(*b*) is also 0.)

When $C_{s1}$ is electrically charged as shown in FIG. 7(*b*), by comparison, a normal difference in output and a normal result of integration corresponding to those in FIG. 4 are obtainable. (Similarly, a normal result of integration can be obtained for the test voltage or current corresponding to those shown in FIGS. 3(*a*) and 3(*b*)

The integrated value of the difference between outputs or the difference between the integrated values of the test voltage or current locates the disconnected point of the gate line.

When the on-off function of the TFT's gate does not work and the TFT remains unactivated on application of a gate voltage, the test voltage or current obtained by the application of gate voltage $V_G$ in the first step is not as shown in FIG. 3(*a*) but as shown at (b) in FIG. 3.

Therefore, the difference in the detection voltage or current obtained in the second step as shown in FIG. 3(*b*) is substantially 0. Accordingly, the result of integration derived therefrom is also 0. (Similarly, the difference between the results of integration obtained from the test voltage or current corresponding to those shown in FIGS. 3(*a*) and 3(*b*) is also 0.)

As is obvious from the above, the method of this invention permits checking whether the TFTs are functioning properly.

Now some examples of this invention based on the operating principle described above will be given below.

Figure 8:
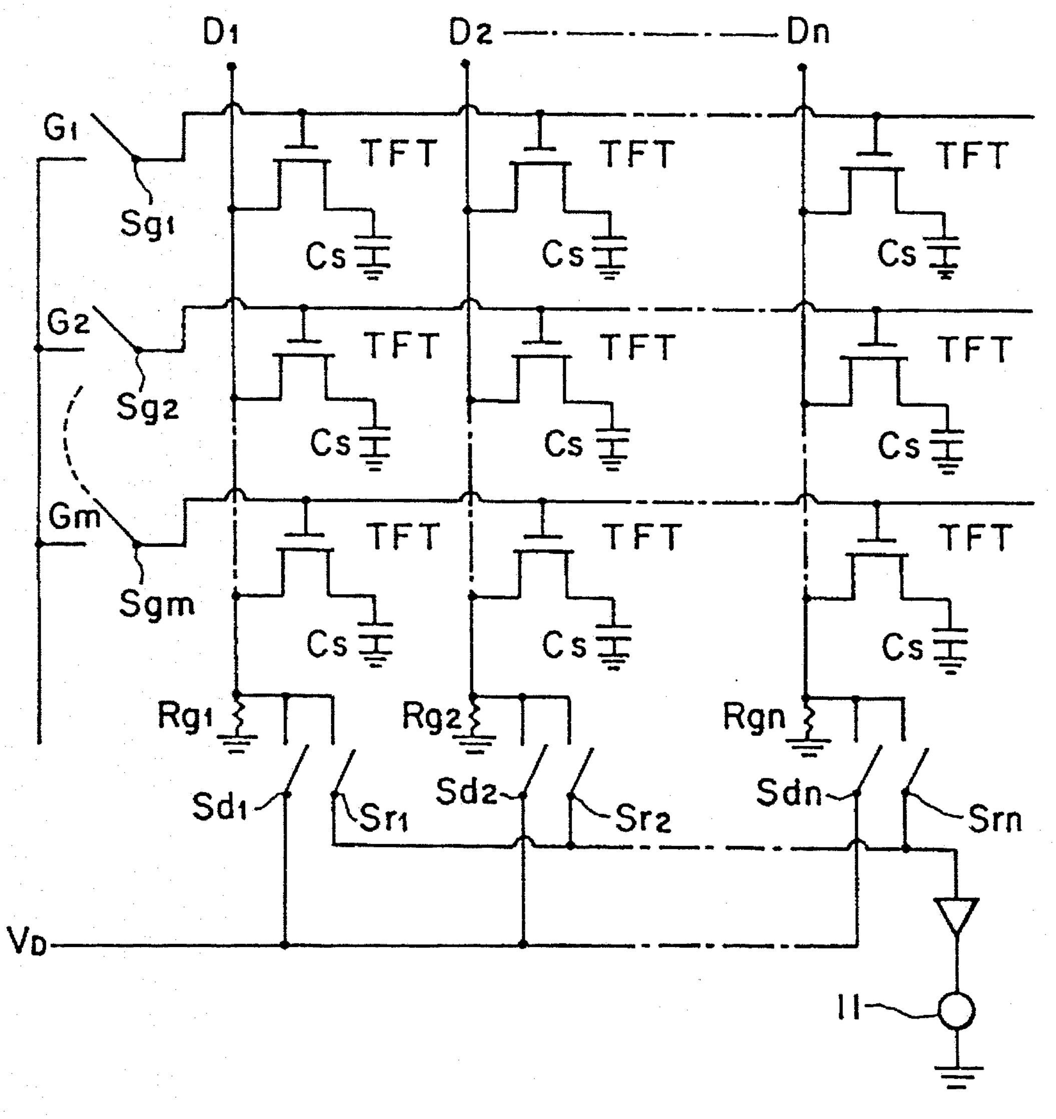
FIG. 8 is an overall view showing the circuit configuration of a first embodiment of this invention.
Figure 9A:
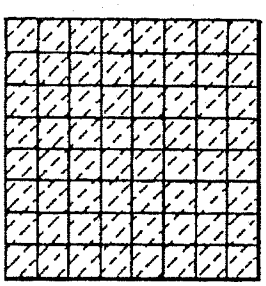
FIG. 9(*a*)–9(*e*) are plan views of display panels simulating the arrangement of TFT-LCDs to show the display area of a second embodiment of this invention.
Figure 9B:
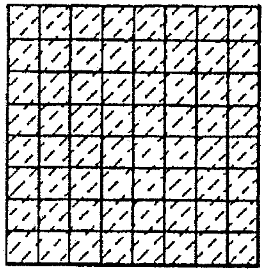
Figure 9C:
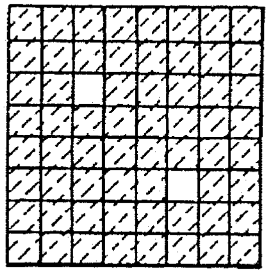
Figure 9D:
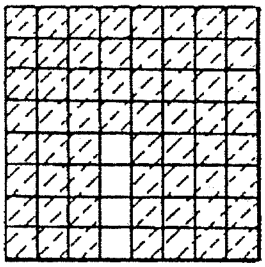
Figure 9E:
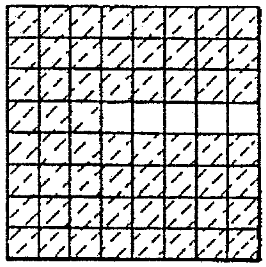

FIG. 8 shows an example of a device used for the implementation of the testing method of this invention.

As shown in FIG. 8, switches $S_{g1}$, $S_{g2}$, . . . $S_{gm}$, are connected to the horizontal gate lines $G_1$, $G_2$, . . . $G_m$ of the TFTs corresponding to the individual picture elements, whereas switches $S_{d1}$, $S_{d2}$, . . . $S_{dn}$ are connected to the horizontal gate lines $D_1$, $D_2$, . . . $D_3$. Also, switches $Sr_{r1}$, $S_{r2}$, . . . $S_{rn}$ are connected to the date lines of the waveform analyzer.

Whether the TFT-LCDs corresponding to all picture elements are properly connected can be efficiently checked by turning on and off the switches $S_{g1}$, $S_{g2}$, . . . $S_{gm}$, $S_{d1}$, $S_{d2}$, . . . $S_{dn}$ and $S_{r1}$, $S_{r2}$, . . . $S_{rn}$ one after another, by using relays as shown in FIG. 8, and then integrating the difference between the individual test voltages or currents or determining the difference between the values obtained by integrating the individual test voltages or currents.

As shown in FIG. 8, a resistor $R_g$ to facilitate the measurement of discharge output is connected to each data line between a point connected to a relay and another point grounded. To reduce errors in measurement, the resistor $R_g$ is designed to have an amount of resistance that is less than approximately one-hundredths of the resistance $R_{on}$ that appears when the TFT is on.

By comparison, the amplifier used for measurement is designed to have an extremely large input impedance.

Even when date and gate lines are short-circuited, most currents pass through the resistors $R_{g1}$, $R_{g2}$ and so on, thereby preventing the gate power supply from entering the input side of the amplifier and, thus, protecting the amplifier and measuring device.

In a device where all TFTs can be tested as shown in FIG. 8, test currents or voltages as shown in FIGS. 3(*a*) and 3(*b*) are determined for the entire TFT-LCD and the difference between the determined test voltages or currents is integrated, or, otherwise, the determined test voltages or currents are integrated and the difference between the integrated values is determined as shown in FIG. 9(*a*) (the hashed areas indicate where the test and calculation are made). If normal results are obtained for each cell capacitor as shown in FIG. 9(*b*) as indicated by the hashed areas, which applies also to FIGS. 9(*c*), 9(*d*) and 9(*e*), the entire device functions properly.

If, however, normal results are not obtained in some areas as shown in FIG. 9(*c*) the connection between the TFT and the gate or data line in such areas is broken.

If normal results are not obtained in all or part of a specific vertical array as shown in FIG. 9(*d*), the connection of the data line itself for that vertical array is improper.

Similarly, if normal results are not obtained in all or part of a specific horizontal array in FIG. 9(*e*), the connection of the gate line for the horizontal array is improper.

Figure 10A:
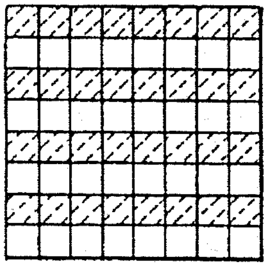
FIGS. 10(*a*), 10(*b*) and 10(*c*) are plan views of display panels simulating the arrangement of TFT-LCDs to show the display area of a third embodiment of this invention.
Figure 10B:
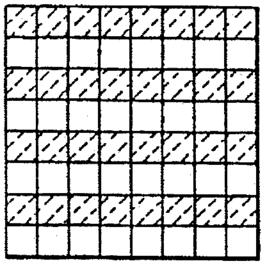
Figure 10C:
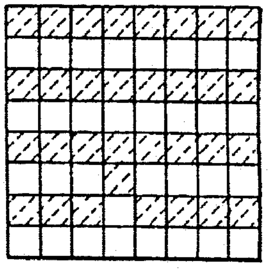

In a device where all TFTs can be tested as shown in FIG. 8, test currents or voltages as shown in FIGS. 3(*a*) and 3(*b*) are determined for every other gate lines in the entire TFT-LCD and the difference between the determined test voltages or currents is integrated, or, otherwise, the determined test voltages or currents are integrated and the difference between the integrated values is determined as shown in FIG. 10(*a*) (the hashed areas indicate where the test and calculation are made). If normal results are obtained for every other gate line as shown in FIG. 10(*b*) (as indicated by the hashed areas, which applies also in FIG. 10(*c*), the connection is proper.

If normal results are obtained for any turned-off gate line as shown in FIG. 10(*c*) the area adjoining that gate line is short-circuited.

Figure 11A:
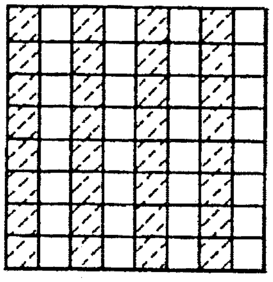
Figure 11B:
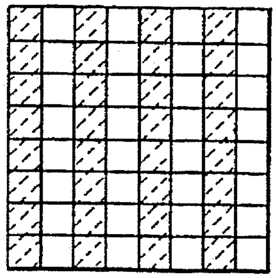
Figure 11C:
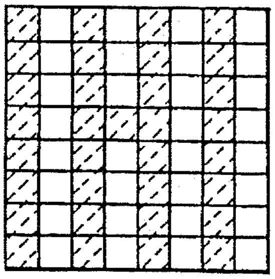

In a device where all TFTs can be tested as shown in FIG. 8, test currents or voltages as shown in FIGS. 3(*a*) and 3(*b*) are determined for every other data line in the entire TFT-LCD and the difference between the determined test voltages or currents is integrated, or, otherwise, the determined test voltages or currents are integrated and the difference between the integrated values is determined as shown in FIG. 11(*a*) (the hashed areas indicate where the test and calculation are made). If a discharge waveform from each cell capacitor is obtained for every other data line as shown in FIG. 11(*b*) (as indicated by the hashed areas, which applies also to FIG. 11(*c*), at least the connection of the electrically charged TFTs is proper.

If normal results are obtained for any uncharged data line as shown at in FIG. 11(*c*), the area adjoining that data line is short-circuited.

In testing the condition of the entire TFT-LCD as in the examples described above, the use of display boards corresponding to the individual TFTs facilitate the location of irregularities.

As is obvious from the above, this invention provides a simple method for quickly and accurately determining if TFT-LCDs are properly connected or if TFTs function properly, without being influenced by the stray capacitance between TFTs or between gate and data lines.

The results of integration derived from the difference between the individual test voltages or currents or the difference between the results of integration obtained from the individual test voltages or currents according to the method of this invention indicates the amount of a truly charged electricity. This permits checking the presence of variations among the cell capacitors $C_s$.

The testing method of this invention is of great value as it permits checking the function of TFT-LCDs during their manufacturing processes.

What is claimed is:

1. A testing method for determining whether the wiring of a thin film transistor-liquid crystal display (TFT-LCD) is correct, whether a state of thin film transistor (TFT) and liquid crystal display (LCD) is normal or whether the operation of a TFT is proper, comprising the following steps in sequence:

a first operation including the steps of:

a first step of turning on the TFT for a given period of time to charge a cell capacitor connected to the LCD through a data line thereof of the TFT, a second step of turning off the TFT for a period of time to maintain a charged condition of said cell capacitor, a third step of turning on the TFT again for a given period of time T to release a stored electric charge through a source and drain of the TFT and through a grounded resistor, a fourth step of inputting changes with time of an output of source current or source voltage induced by the discharge into a computer, a second operation including the steps of:

a fifth step of turning on the TFT for a given period of time without charging the cell capacitor connected to the LCD through the data line thereof, a sixth step of turning off the TFT for the same period of time as that during which the charged condition was maintained in the second step, a seventh step of turning on the TFT again for a given period of time T to release the stored electric charge through the source and drain of the TFT and through the grounded resistor, an eighth step of inputting changes with time of the output of source current or source voltage induced by the discharge into the computer, and a third operation including the steps of:

a ninth step of calculating with the computer an integration as follows to obtain a calculation:

$$\int_0^T (i_1 - i_2)dt \text{ or } \int_0^T (v_1 - v_2)dt$$

and a tenth step of judging whether or not the TFT-LCD is properly wired or the state of TFT and LCD is normal or not by checking whether the above calculation is smaller than a reference value.

2. A testing method according to claim 1, further comprising the step of repeating the first through third operations checking the gate and data lines of multiple TFTs connected to each other one after another in order to check the gate and data lines thereof for irregularities in the wiring of the TFT-LCD or the function of the TFT.

3. A testing method according to claim 1, further comprising the step of checking if the calculations from said ninth step are greater than said reference value throughout the entirety of the TFT-LCD to detect the presence of disconnections in the gate and data lines.

4. A testing method according to claim 1, further comprising the step of checking if the calculations from said ninth step are greater than said reference value for every other gate line throughout the entirety of the TFT-LCD to detect the presence of short-circuiting between gate lines.

5. A testing method according to claim 1, further comprising the step of checking if the calculations from said ninth step are greater than said reference value for every other data line throughout the entirety of the TFT-LCD to detect the presence of short-circuiting between data lines.

6. A testing method for determining whether the wiring of a thin film transistor-liquid crystal display (TFT-LCD) is correct, whether a state of thin film transistor (TFT) and liquid crystal display (LCD) is normal or whether the operation of a TFT is proper, comprising the following steps in sequence:

a first operation including the steps of:

a first step of turning on the TFT for a given period of time to charge a cell capacitor connected to the LCD through a data line thereof of the TFT, a second step of turning off the TFT for a period of time to maintain a charged condition of said cell capacitor, a third step of turning on the TFT again for a given period of time T to release a stored electric charge through a source and drain of the TFT and through a grounded resistor, a fourth step of inputting changes with time of an output of source current $i_1$ or source voltage $v_1$ induced by the discharge into a computer, a second operation including the steps of:

a fifth step of turning on the TFT for a given period of time without charging the cell capacitor connected to the LCD through the data line thereof, a sixth step of turning off the TFT for the same period of time as that during which the charged condition was maintained in the second step, a seventh step of turning on the TFT again for a given period of time T to release the stored electric charge through the source and drain of the TFT and through the grounded resistor, an eighth step of inputting changes with time of the output of source current $i_1$ or source voltage $V_1$ induced by the discharge into the computer, and a third operation including the steps of:

a ninth step of calculating with the computer an integration as follows to obtain a calculation:

$$\int_0^T (i_1 - i_2)dt \text{ or } \int_0^T (v_1 - v_2)dt$$

and a tenth step of judging whether or not the TFT-LCD is properly wired or the state of TFT and LCD is normal or not by checking whether the above calculation is smaller than a reference value of $V_sC_{so}(R_{on}+R_g)$ or $I_sC_{so}(R_{on}+R_g)$ where $V_s$ is a standard initial value of source voltage for a normal LCD and TFT at the time of discharge of said cell capacitor ($C_s$) when the gate of the TFT is on and a data voltage $V_D$ is not supplied to the TFT, $I_s$ is a standard initial value of current at the time of discharge of said cell capacitor ($C_s$) for a normal LCD and TFT, $C_{so}$ is a value of capacitance of the normal LCD, $R_{on}$ is a standard and normal value of resistance between the source and drain of the TFT when a data line thereof is on, and $R_g$ is a value of resistance which is set up at a source line of the TFT.

7. A testing method according to claim 6 further comprising the step of repeating the first through third operations checking the gate and data lines of multiple TFTs connected to each other one after another in order to check the gate and data lines thereof for irregularities in the wiring of the TFT-LCD or the function of the TFT.

8. A testing method according to claim 6, further comprising the step of checking if the calculations from said ninth step are greater than said reference value throughout the entirety of the TFT-LCD to detect the presence of disconnections in the gate and data lines.

9. A testing method according to claim 6, further comprising the step of checking if the calculations from said ninth step are greater than said reference value for every other gate line throughout the entirety of the TFT-LCD to detect the presence of short-circuiting between gate lines.

10. A testing method according to claim 6, further comprising the step of checking if the calculations from said ninth step are greater than said reference value for every other data line throughout the entirety of the TFT-LCD to detect the presence of short-circuiting between data lines.

* * * * *